(12) United States Patent
Singh et al.

(10) Patent No.: US 7,479,915 B1
(45) Date of Patent: Jan. 20, 2009

(54) COMPARATOR ARCHITECTURE

(75) Inventors: Ramesh Kumar Singh, Bangalore (IN); Nitin Agarwal, Bangalore (IN); Abhaya Kumar, Bangalore (IN); Visvesvarya Pentakota A, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/959,494

(22) Filed: Dec. 19, 2007

(51) Int. Cl.
*H03M 1/38* (2006.01)

(52) U.S. Cl. .......................... 341/161; 318/729; 326/93; 327/536

(58) Field of Classification Search ......... 341/139–165; 318/729; 326/93; 327/536
See application file for complete search history.

(56) References Cited

U.S. PATENT DOCUMENTS 4,480,219 A * 10/1984 Shackle et al. .............. 318/729
6,424,178 B1 * 7/2002 Harrison ...................... 326/93
7,034,733 B2 * 4/2006 Dedic et al. ................. 341/150
2001/0001230 A1 * 5/2001 Proebsting ................... 327/536

OTHER PUBLICATIONS

Dong-Young Chang, "Design Techniques for a Pipelined ADC Without Using a Front-End Sample-and-Hold Amplifier", IEEE Transactions on Circuits and Systems-I: Regular Papers, vol. 51, No. 11, Nov. 2004.

* cited by examiner

*Primary Examiner*—Lam T Mai
(74) *Attorney, Agent, or Firm*—Warren J. Franz; Frederick J. Telecky, Jr.; Wade J. Brady, III

(57) ABSTRACT

A comparator presents a linear load to input signals when providing a comparison output of two input signals. The comparator contains a transistor configured in a source/emitter follower configuration, and operates in the saturation region for substantially the entire range of strengths of the input signals. As a result, the comparator presents a substantially constant load to the input signals. When incorporated in circuits such as a pipeline ADC, the comparator may substantially eliminate errors due to non-linear loads.

16 Claims, 4 Drawing Sheets

US 7,479,915 B1

COMPARATOR ARCHITECTURE

BACKGROUND

1. Field of the Technical Disclosure

The present disclosure relates generally to circuit design, and more specifically to a novel comparator architecture.

2. Related Art

A comparator refers to a component which receives a first input signal on a first terminal and a second input signal on a second terminal, and generates an output signal on an output signal indicating a result of comparison of the two signals. The output signal may equal one logical value upon one comparison result (e.g., the first signal has a voltage greater than that of the second signal) and another logical value otherwise.

It is often desirable that comparators meet requirements specific to the environment in which they are deployed.

BRIEF DESCRIPTION OF THE DRAWINGS

The present invention will be described with reference to the following accompanying drawings, which are described briefly below.

In the drawings, like reference numbers generally indicate identical, functionally similar, and/or structurally similar elements. The drawing in which an element first appears is indicated by the leftmost digit(s) in the corresponding reference number.

DETAILED DESCRIPTION

Overview

A comparator provided according to an aspect of the present invention contains a transistor configured in a source follower configuration, a capacitor and a latch. In an embodiment, a terminal of the capacitor is connected to a control terminal of the source follower. The capacitor is first charged with one of the input signals. The other input signal is then applied to the capacitor without providing a discharge path such that the voltage at the control terminal of the source follower is changed by a value equal to the difference between the voltages of the two input signals.

The changed voltage (minus a threshold voltage) is available at the source terminal of the source follower and is compared with a reference voltage by the latch. The reference voltage may be selected such that the difference of the reference voltage and the changed voltage (minus the threshold voltage) at the source terminal equals the difference of the voltages of the two input signals. The output of the latch is at one binary value for one comparison result of the two input signals and another binary value otherwise.

The transistor configured in the source follower configuration is operated in the saturation region for substantially the entire range of strengths of the input signals. As a result, the comparator presents a linear load to the input signals. When incorporated in circuits such as a pipeline ADC, the comparator substantially eliminates errors due to non-linear loads.

Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well known structures or operations are not shown in detail to avoid obscuring the features of the invention.

2. Example Device

Figure 1:
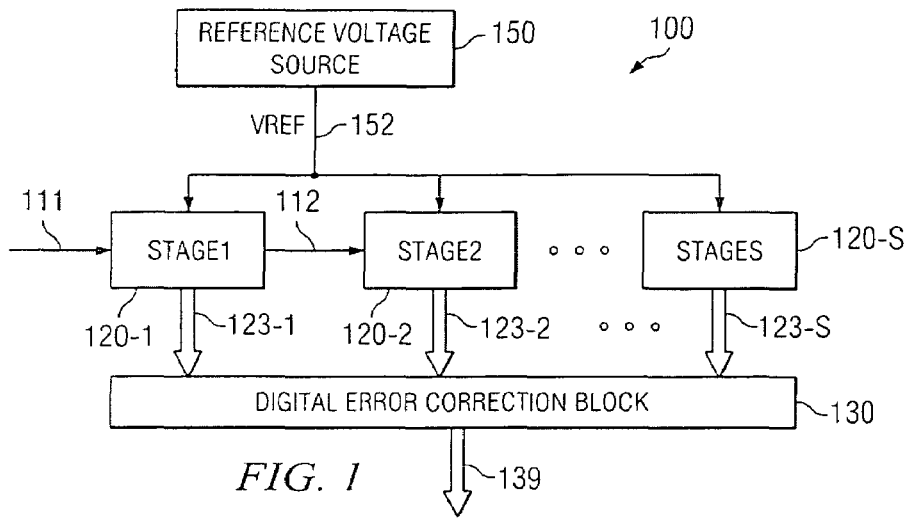
FIG. 1 is a block diagram illustrating the details of an example environment in which several aspects of the present invention can be implemented.

FIG. 1 is a block diagram illustrating the details of an example device in which several aspects of the present invention can be implemented. High speed pipeline ADC 100 is shown containing stages 120-1 through 120-S, digital error correction block 130, and reference voltage source 150. Each block is described below in further detail.

Digital error correction block 130 receives sub-codes from various stages (on paths 123-1 through 123-S respectively), and generates a digital code representing a corresponding sample of the input signal received on path 111. Various error correction approaches, well known in the relevant arts, may be used to correct any errors in the received sub-codes. The generated digital code is provided on path 139 as a final digital code corresponding to the voltage of a sample of the input analog signal (path 111) at a particular time instant.

Reference voltage source 150 provides reference voltages to stages 120-1 through 120-S. Multiple references voltages are assumed to contained in path 152. The corresponding reference voltages may be used by respective stages 120-1 through 120-S in generating the respective digital codes noted above, and is described in greater detail in sections below.

Each of stages 120-1 through 120-S generates a sub-code corresponding to a voltage level of a signal received as an input, and except for the last stage 120-S generates an amplified residue signal as an input to a next stage. For example, stage 120-1 converts a voltage level on path 111 (on which the input signal is received) to generate a sub-code on path 123-1, and the amplified residue signal generated on path 112 is provided as an input to stage 120-2.

Figure 2:
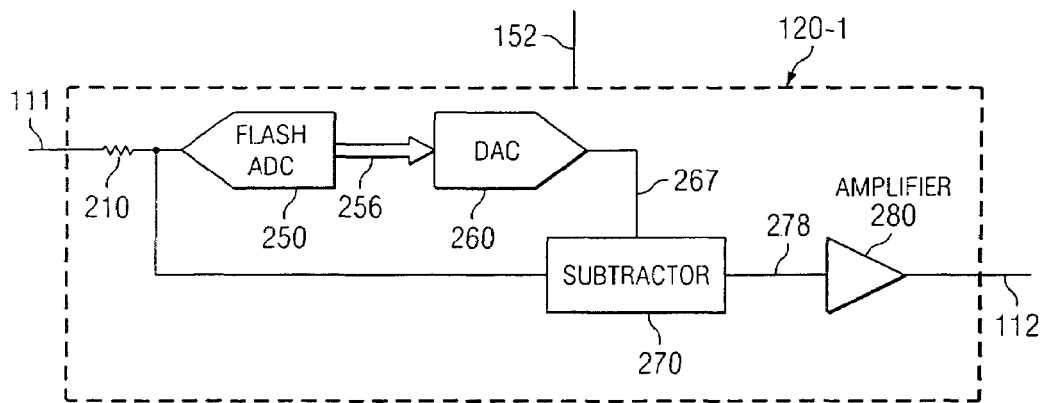
FIG. 2 illustrates the logical operation of a stage of a high speed pipeline ADC.

FIG. 2 further illustrates the logical operation of a stage (described with reference to stage 120-1 only, for conciseness) of pipeline ADC 100 according to a known approach.

With respect to FIG. 2, stage 120-1 is shown containing resistor 210, flash ADC 250, digital to analog converter (DAC) 260, subtractor 270 and amplifier 280.

Flash ADC 250 (an example of a sub ADC) converts a sample of an analog signal received on path 111 into a corresponding P-bit sub-code provided on path 256 (contained in path 123-1 of FIG. 1, and P is less than N, wherein N is the number of bits in the final digital code provided on path 139 of FIG. 1).

DAC 260 converts the sub-code received on path 256 into corresponding analog signal (Vdac) on path 267. Subtractor 270 generates a residue signal as the difference of sample 111 (Vi) and the analog signal received on path 267. Amplifier 280 amplifies the residue signal (Vi-Vdac) which is then provided on path 112 as an amplified residue signal. The signal on path 112 is used to resolve the remaining bits in the N-bit digital code by the subsequent stages of the ADC.

Resistor 210 represents the resistance of the path (wiring/track) from the input 111 (for e.g., from an external package pin of an IC containing the circuit of FIG. 1) to inputs of flash ADC 250 and subtractor 270. The resistance may include designer included components for various purposes and/or the inherent resistance of the path.

Although shown as separate blocks, DAC 260, subtractor 270 and amplifier 280 are often implemented as single circuit termed a multiplying DAC (MDAC), as described next.

A comparator provided according to an aspect of the present invention is employed within flash ADC 250. The motivation for that embodiment can be appreciated based on the detail of operation of the rest of the stage. Accordingly, the description is continued with respect to the details of the stage.

3. Stage Details

Figure 3A:
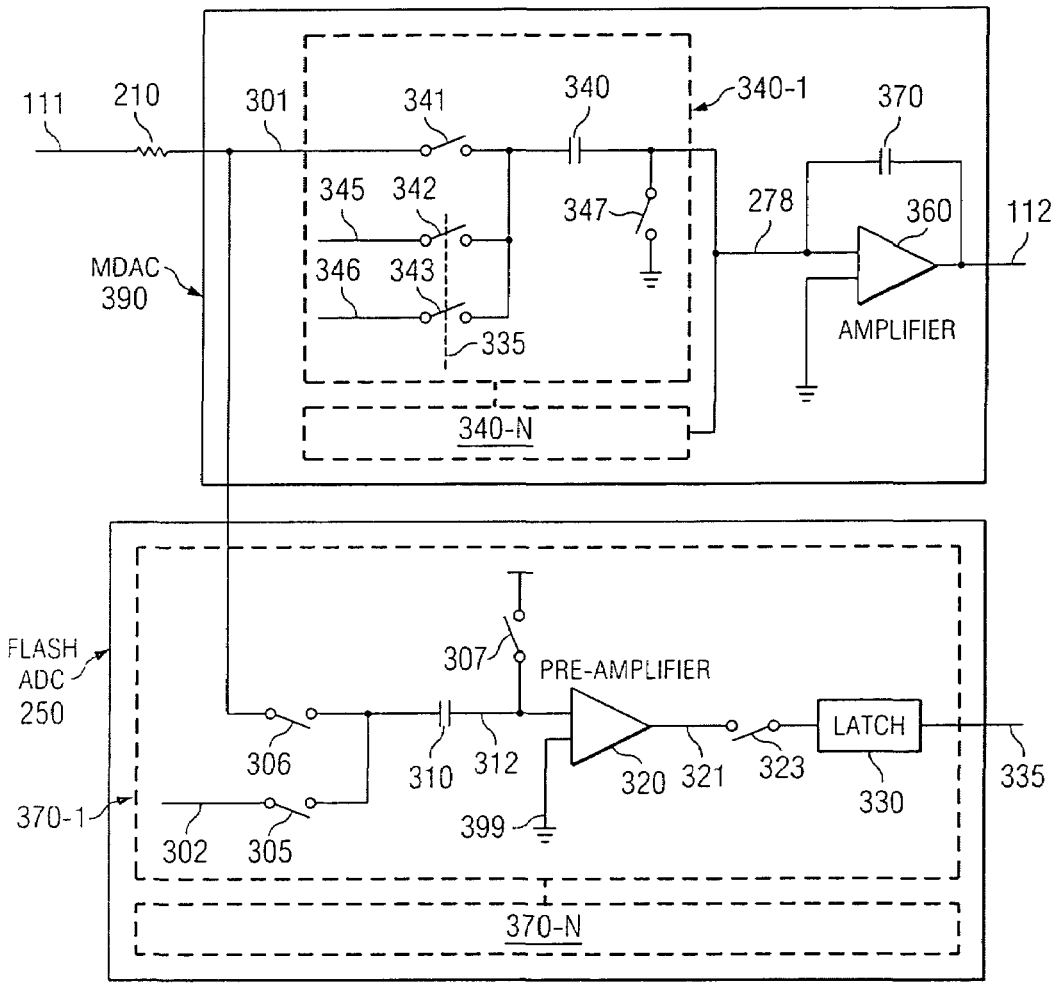
FIG. 3A is a circuit diagram illustrating the internal details of a stage of a high speed pipeline ADC in an embodiment.

FIG. 3A is a circuit diagram illustrating the internal details of stage 120-1 of high speed pipeline ADC 100 in an embodiment. In the Figure, paths 302, 345 and 346 contain respective reference voltages (which may be generated internally by, for example, a voltage divider network), deemed to be contained in path 152 in FIG. 1. Although signal paths in high speed pipeline ADC 100 are shown as single-ended in FIGS. 1, 2 and 3A, it must be understood that high speed pipeline ADC 100 and constituent stages may be implemented to process differential signals as well, in which case each of the respective signal paths may contain conductor pairs.

Flash ADC 250 contains (at least substantially) identical circuit portions 370-1 through 370-N, with only portion 370-1 shown in detail for conciseness. In general, the circuit portions operate in parallel, with each circuit portion providing a comparison result (often a single bit) of input signal 111 with a corresponding reference voltage. The number of circuit portions depends generally on the number of bits in the P-bit sub-code provided by flash ADC 250.

As is well known in the relevant arts, the reference voltage Vref (152) may be divided into sub-voltages of $2^P$ steps (usually equals), and the voltage at each level by a corresponding circuit portion with the signal received from node 301. The comparison results are examined to determine the P-bit sub-code from stage 120-1.

Circuit portion 370-1 is shown containing sampling capacitor 310, pre-amplifier 320, latch 330 and switches 305, 306, 307 and 323.

MDAC 390 represents the combination of DAC 260, subtractor 270 and amplifier 280, and is shown containing substantially identical circuit portions 340-1 through 340-N, amplifier 360 and feedback capacitor 370. Only portion 340-1 is shown in detail for conciseness. Each portion 340-1 through 340-N receives a latched output from a corresponding one of circuit portions 370-1 through 370-N, and provides a corresponding analog voltage, all of which add on path 278.

Circuit portion 340-1 is shown containing sampling capacitor 340, and switches amplifier 360, feedback capacitor 370, and switches 345 and 355.

Figure 3B:
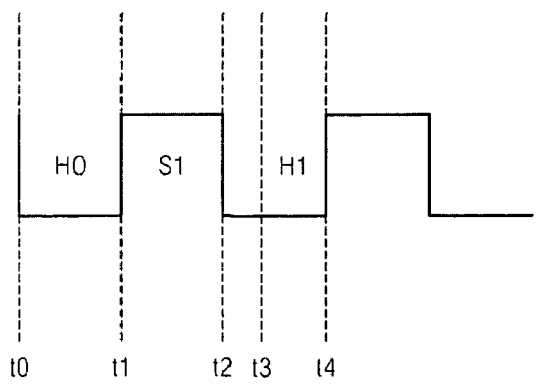
FIG. 3B is a timing diagram illustrating the operations of portions of a stage of a high speed pipeline ADC.

The operation of the circuit of FIG. 3A is described with combined reference to the timing diagram of FIG. 3B. Again for conciseness, the description is provided with respect only to circuit portion 370-1 and 340-1. However, it must be understood that other corresponding circuit portions noted above would also be operational in parallel.

During a previous hold phase H0 (time period from t0 to t1 in FIG. 3B), switches 305 and 307 (as well as corresponding switches in the other circuit portions 370-2 through 370-N) of flash ADC 250 are closed, while switches 306 and 323 are open. As a result, capacitor 310 is charged to a reference voltage (VREFA, derived from Vref 152) connected on path 302. Switch 307 connects node 312 to a common mode reference voltage when closed.

During a current sampling phase S1 (time period from t1 to t2 in FIG. 3B), switches 305 and 307 (as well as corresponding switches in the other circuit portions 370-2 through 370-N) of flash ADC 250 are open, while switches 306, and 323 are closed. As a result, voltage at node 312 changes during S1 to a voltage (Vin-VREFA), Vin being the voltage of the input signal 111, which may be varying.

Pre-Amplifier 320 provides via paths 321 and switch 323, an amplified version of the difference voltage (Vin-VREFA) to latch 330. Latch 330 amplifies the difference voltage on path 321 and provides a digital value as a comparison of the voltage 321 and a threshold voltage (not shown but provided as another input to latch 330).

Thus, during current sampling phase S1, flash ADC 250 provides a digital output representing the comparison result of the input voltage Vin (path 111) with a corresponding reference voltage (302). It may be appreciated that circuit portion 370-1 (as well as portions 370-2 through 370-N) operates as a comparator (henceforth referred to also as comparator 370-1), effectively providing a comparison result of Vin and VREFA.

Also during S1, switches 341 and 347 of MDAC 390 are closed, while switches 342 and 343 are open. As a result, capacitor 340 charges to the voltage of the input signal 111, which may be varying.

At time instance t2, latch 330 receives a latch enable signal (e.g., a clock signal, not shown), and latches the output of comparator 320. The latched output 335 of latch 330 is stable and available at time instance t3, and is used to control the connection of a corresponding reference voltage. The latching operation of latch 330 is performed during a current hold phase H1.

Also during H1, at time instance t2, switches 341 and 347 of MDAC 390 are opened. At time instance t3 one (and only one) of switches 342 and 343 is closed. Which one of switches 342 and 343 is closed is controlled by the logic level of the digital bit on path 335 (being the output of latch 330). One logic level (e.g., logic 1) closes switch 342, connecting a reference voltage on path 345 to capacitor 340, while the other logic level closes switch 343 connecting a common mode reference voltage (REFCM) on path 345 to capacitor 340.

In effect, the operation of stage 120-1 of FIG. 3A causes circuit portions 340-1 through 340-N of MDAC 390 to begin at time instance t3 to generate a difference voltage equal to the difference of input signal 111 and the sub-code generated by flash ADC 250. The difference voltage on path 278 is amplified by amplifier 360, and is provided to the next stage 120-2 at time instance t4.

It may be appreciated from the description above, that flash 250 generates the sub-code during the interval when MDAC 390 is sampling input 111, i.e., during sampling phase S1. As a result, the outputs (individual bits of the sub-code) are available to MDAC 390 after a small delay (t3-t2, latching delay in latch 330), thereby providing MDAC 390 with sufficient time (t4-t3) to generate the residue on path 112.

Once the sub-codes are thus provided, digital error correction block 130 may then compute the N-bit code based on the P-bit codes received from the respective stages.

At least in such an environment, it may be desirable that comparator 370-1 present a linear load at node 301. To illustrate with respect to FIG. 3A, assuming comparator 370-1 presents a non-linear load to a signal on node 301 (and therefore also to input signal 111), comparator 370-1 would draw a current which varies non-linearly with respect to the strength of signal 111.

The non-linear variation in current drawn by comparator 370-1 produces a voltage drop across resistor 210, which also varies non-linearly. Denoting the voltage drop across resistor 210 as Ve, the voltage sampled by MDAC 390 is (Vin-Ve), which has an error term (Ve) which varies non-linearly with respect to the strength of signal 111. Further the extent of non-linearity increases as the frequency of input signal 111 increases. Such a non-linear error term causes the output codes on path 139 (FIG. 1) to also be in error.

Further, such an error is a dynamic error that varies with the strength of input signal 111, and may be difficult to correct by post-processing techniques (as against a fixed error, which may be easily correctable).

Figure 4:
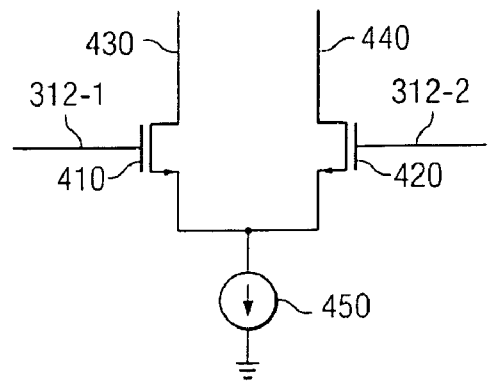
FIG. 4 is a diagram illustrating the internal details of a pre-amplifier used in a comparator portion in a sub-ADC of a high speed pipeline ADC according to a prior technique.

In a prior implementation of stage 120-1 implemented to process differential signals, pre-amplifier 320 (contained in comparator 370-1) is implemented as a differential pair, as shown in FIG. 4.

4. Prior Amplifier

The details of pre-amplifier 320 in a prior embodiment are depicted in FIG. 4. Merely for illustration and ease of understanding, the prior amplifier is described as being implemented in the context of FIG. 3A. Pre-amplifier 320 is shown containing MOS transistors 410 and 420, and constant current sink 450.

Transistor 410 receives on path 312-1 one arm (Vinp-VREFAp) of the differential signal 312, while transistor 420 receives on path 312-1 the other arm (Vinm-VREFAm) of the differential signal 312, where Vinp and Vinm represent respectively the positive and negative arms of the differential input (Vin) on path 111, and VREFAp and VREFAm represent respectively the positive and negative arms of the reference voltage VREFA on path 302. (It is noted here that if single-ended signals were to be processed, one of 312-1 and 312-2 would received the signal ended input signal Vin, and the other would receive a common mode reference voltage).

In operation, depending on the strength of the signal on the paths (312-1/312-2), transistors 410/420 (which may, for example, be Metal Oxide Semiconductor Field Effect Transistors—MOSFET) operate in a sub-threshold, linear or saturation region. As a result, the capacitive load presented by the transistors (on input terminals) also varies depending on the strength of the input signal, as is well known in the relevant arts.

In general, depending on the strength of input signal 111, the number of transistors in corresponding amplifiers (such as pre-amplifier 320) in flash ADC 250 that are operative in the sub-threshold, linear or saturation region varies. Further, the load current drawn by the amplifiers varies non-linearly with respect to input signal 111. As a result and as noted above, the voltage drop Ve across resistor 210 also varies non-linearly, resulting in the input (Vin-Ve) provided to MDAC 390 having a non-linear error component.

According to an aspect of the present invention, errors due to non-linear load presented by comparators in a sub-ADC of a pipeline ADC are reduced or eliminated, as described next.

5. Comparator Presenting Linear Load

Figure 5:
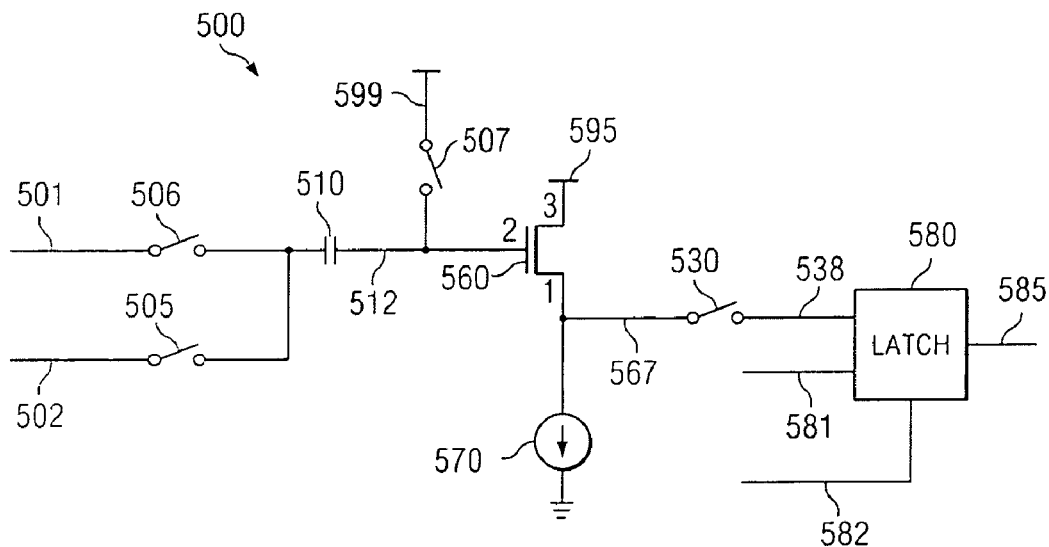
FIG. 5 is a circuit diagram of a comparator in an embodiment of the present invention implemented to process single-ended input signals.

FIG. 5 is a circuit diagram illustrating the details of a comparator in an embodiment of the present invention that is implemented to process single-ended signals. Comparator 500 is shown containing capacitor 510, transistor 560, constant current sink 570, switches 505, 506, 507 and 530, and latch 580.

Switches 505, 506, 507 and 530 are operable to be closed or open by respective clock signals. Though the clock signals are not shown, the specific time instances at which each of the switches is to be opened and closed is described in sections below.

Comparator 500 receives two inputs, one each on paths 501 and 502. Switch 507 when closed connects node 512 to a bias terminal 599 (for example, a power supply terminal). Terminal 595 provides another power supply, which can potentially be the same as the power supply provided on bias terminal 599.

Latch 580 receives a reference voltage on path 581, a strobe signal on path 582, and an input voltage on path 538 and provides a binary comparison of the two voltages (581 and 538) on path 585. As described below, the strobe signal is activated when the output has to be provided, and kept inactive otherwise. The strobe signal may be generated internally within ADC 100 in a known way. In an embodiment, the reference voltage on path 581 is equal to the difference of the bias voltage 599 and the gate to source voltage (Vgs) of transistor 560.

Transistor 560 and constant current sink 570 are connected in a source follower configuration. Transistor 560 may be implemented, for example, as a bipolar junction transistor (BJT), field effect transistor (FET), or metal oxide semiconductor field effect transistor (MOSFET). Transistor 560 is always (at least as relevant to when the comparison operation is being performed) operated in the saturation region if implemented as a MOSFET/FET (if implemented as a BJT, transistor 560 is always operated in the active region).

Assuming transistor 560 is a BJT, terminals marked 1, 2 and 3 in the figure respectively represent the emitter, base (control) and collector terminals. However, the source follower circuit can be implemented using any other technologies available in the market, and the modification of the remaining circuit to operate in conjunction with such a source follower circuit will be apparent to one skilled in the relevant arts.

If transistor 560 is a FET or MOSFET, terminals marked 1, 2 and 3 in the figure respectively represent the source, gate (control) and drain terminals. Terminal 1 of transistor 560 is connected to constant current sink 570, terminal 2 is connected to capacitor 510, and terminal 3 is connected to a power supply terminal. A second terminal of constant current sink 570 is connected to a ground terminal. The implementation of constant current sink 570 will be apparent to one skilled in the relevant arts.

It should be understood that the combination of transistor 560 and constant current sink 570 together operates as a source follower circuit. However, alternative implementations can be used for obtaining the corresponding follower circuits. As is well known, a follower circuit tracks the input signal (typically with some offset). Further, node/path 567 represents an output of the follower circuit. From the above, it should be appreciated that the signal characteristic on such output tracks the input provided on control terminal 512.

The comparison output of comparator 500 is provided on path 585. The output 585 is at one logic level (e.g., logic 1) when the signal on path 501 (V501) is greater than the signal on path 502, and at the other logic level when the signal on path 502 (V502) is greater than the signal on path 501, as described below.

Figure 6:
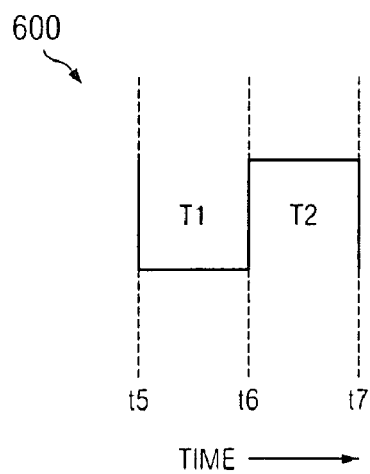
FIG. 6 is a timing diagram used to illustrate the operation of a comparator according to an embodiment of the present invention.

The operation of comparator 500 in an embodiment of the present invention is described next with reference to the timing diagram of FIG. 6, in which one cycle of a clock signal 600 applied to operate switches 505, 506, 507 and 530 is shown. While a single clock signal 600 is shown in FIG. 6 for conciseness, the switches may be operated based on separate clock signals also.

During interval T1 (between time instances t5 to t6), switches 505 and 507 are closed while switches 506 and 530 are open, and capacitor 510 is charged to a voltage equal to the difference of bias voltage 599 and the voltage (V502) of input signal on path 502.

During interval T2 (between time instances t6 to t7) switches 506 and 530 are closed, and switches 505 and 507 are open. Since the voltage across capacitor 510 cannot change (there being no discharge path), a sum of the voltage across capacitor 610 and the input 501 is generated on path 512.

Since transistor 560 is configured as a source follower, a voltage equal to the difference of the voltage on path 512 and the gate to source (Vgs) voltage (voltage between terminals 2 and 1 of transistor 560) is generated on node/path 567. Since switch 530 is also closed during this interval (T2), latch 580 receives (samples) the voltage on path 567 (made available on path 538 when switch 530 is closed).

At time instance t7, strobe signal 582 goes active (for example, a rising edge), and latch 580 provides a digital value on path 585 which is a comparison output of the voltage on paths 538 (equal to the voltage on path 567) and the reference voltage on path 581.

It must be understood that while charging of capacitor 510 using the two input signals at non-overlapping durations represents an example approach to determine the difference of the respective voltage levels, it should be appreciated that alternative techniques and structures can be employed to derive the same result, without departing from the scope and spirit of several aspects of the present invention.

To illustrate the operation of comparator 500 with an example, assuming path 501 receives an input voltage of 1.1V, and path 502 receives an input voltage of 1V (an example of when V501 is greater than V502), at the end of time interval T1, capacitor 510 is charged to a voltage equal to 0.8V (1.8V−1V, 1.8V being the bias voltage 599, and 1V being the input voltage 502).

During T2, since voltage across capacitor 510 cannot change, the voltage at node 512 equals 1.9V (0.8V+1.1V, 1.1V being the input voltage 501). Assuming Vgs equals 0.7V, the voltage at node 567 equals +1.2V (1.9V-0.7V). As noted above, node 581 receives a reference voltage equal to the difference of the bias voltage 599 and the gate to source voltage (Vgs) of transistor 560, i.e., a reference voltage of 1.1V.

Thus, at t7 (time instance when strobe signal 582 is activated), node 538 receives 1.2V, with node 581 having 1.1V, i.e., latch 580 receives a difference of +0.1V. It may be observed that this difference (+0.1V) is also equal to the difference of the inputs on paths 501 and 502. Latch 580 amplifies the difference and provides a digital output at logic high (1) on path 585.

Assuming path 501 receives an input voltage of 1V, and path 502 receives an input voltage of 1.1V, at the end of time interval T1 (an example of when V501 is less than V502), capacitor 510 is charged to a voltage equal to 0.7V (1.8V−1.1V, 1.8V being the bias voltage 599, and 1.1V being the input voltage 502). During T2, since voltage across capacitor 510 cannot change, the voltage at node 512 equals 1.7V (0.7V+1V, 1V being the input voltage 501). The voltage at node 567 equals 1V (1.7V−0.7V).

When switch 530 is closed at t7, node 538 receives 1V, with node 581 having 1.1V, i.e., latch 580 receives a difference of −0.1V. It may be observed that this difference (−0.1V) is also equal to the difference of the inputs on paths 501 and 502. Latch 580 amplifies the difference and provides a digital output at logic low (0) on path 585.

In particular, it may be observed that due to the application of bias voltage 599, transistor 560 is always operated in the saturation region for all (or substantially most ranges of) strengths of inputs 501 and 502. As a result, the capacitive load presented by transistor 560 is substantially constant.

When incorporated in stage 120-1 (FIG. 3A) of a pipeline ADC 100, comparator 500 can be used in place of comparator 370-1. In such an arrangement, paths 501 and 502 correspond to paths 301 and 302 respectively, switches 505, 506, 507 and 530 correspond respectively to switches 305, 306, 307 and 323, capacitor 510 corresponds to capacitor 310, path 512 corresponds to path 312, pre-amplifier 320 corresponds to the combination of transistor 560 and constant current sink 570, path 321 corresponds to path 567, latch 330 corresponds to latch 580, and path 335 corresponds to path 585.

When used in place of comparator 370-1 of FIG. 3A, transistor 560 can be operated in the saturation region for the entire (or substantially the entire) range of strengths of input signal 111, and presents a substantially constant load to input signal 111. Comparator 500 may also be used in place of corresponding comparators in other stages of pipeline ADC 100. However, it may be appreciated that since stage 1 (120-1) receives an input which may be varying (i.e., the input may not be sampled and held at a steady value), the effect of a non-linear load in stage 1 typically contributes more to a corresponding error, and thus may be of greater concern. Subsequent stages (stages 2 through S), on the other hand, typically receive a sampled and held value, and the corresponding non-linear error contribution due to a non-linear load may be negligible. Consequently, comparator 500 may typically be used in stage 1.

Voltage drop Ve across resistor 210 is, thus, made linearly proportional (e.g., a constant offset) to input signal 111, and may be computed a priori, and accounted for within pipeline ADC 100. For example, digital error correction block 130 (FIG. 1) may subtract a digital value equal to or proportional to Ve from the corresponding sub-codes. The final/overall digital codes provided on path 139 (FIG. 1) is thus provided with reduced errors.

Figure 7:
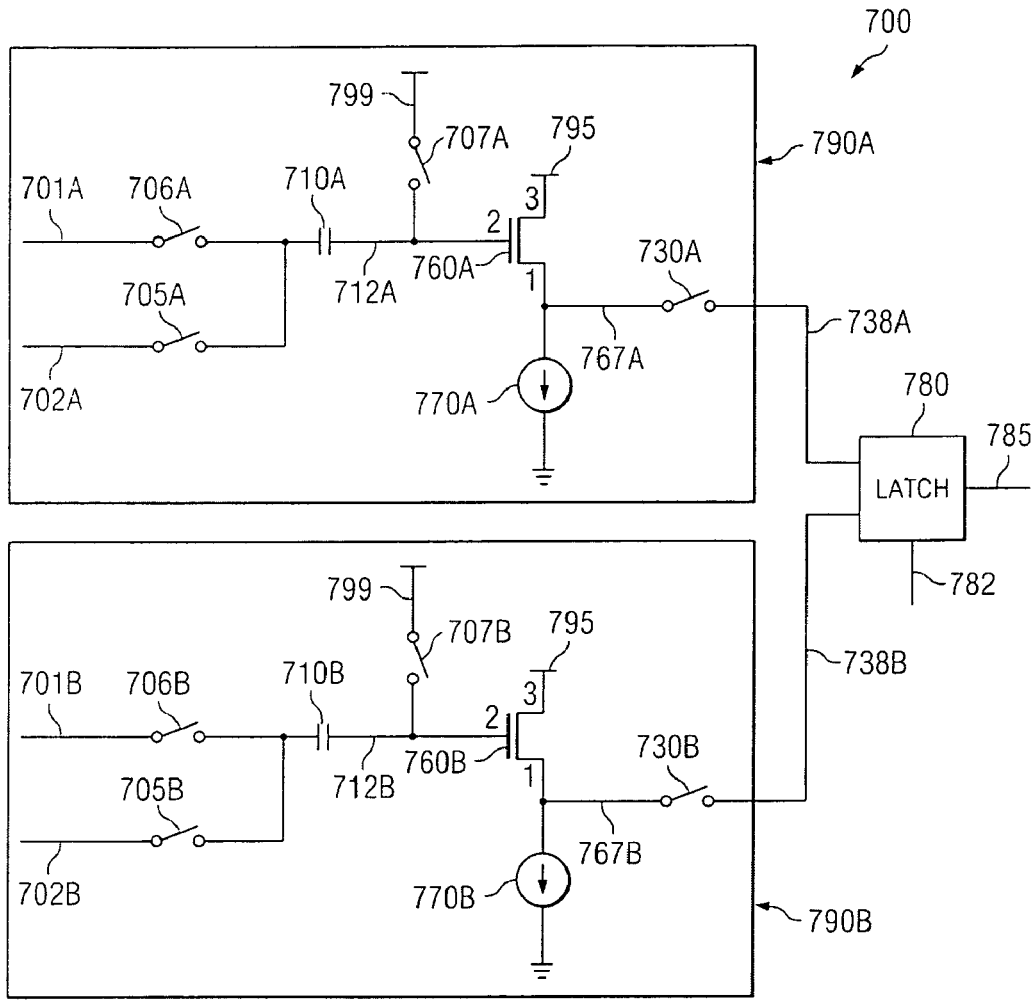
FIG. 7 is a circuit diagram of a comparator in an embodiment of the present invention implemented to process differential input signals.

FIG. 7 is a diagram illustrating the details of a comparator in another embodiment of the present invention that is implemented to process differential signals. Comparator 700 is shown contain circuit portion 790A and 790B, and latch 780. Each of portions 790A and 790B is implemented substantially identical to the corresponding portion in FIG. 5 (all components except latch 580 in FIG. 5).

Path 701 (containing differential signal paths 701A and 701B) receives a differential input (across 701A and 701B), while path 702 (containing differential signal paths 702A and 702B) receives another differential input (across 702A and 702B). Latch 780 receives inputs on path 738A and 738B, a strobe signal on path 782 and provides a digital output on path 785 when strobe signal 782 is activated.

Digital output 785 is at one logic level if input 701 is greater than input 702, and at the other logic level when input 701 is less than input 702. Comparator 700 can be used in place of corresponding comparators in one or more stages of a pipeline ADC similar to as noted above with respect to comparator 500, and enables overall digital codes of the pipeline ADC to be provided with reduced errors.

A comparator implemented in a manner described above may be incorporated in a device/system, as described next.

6. Device/System

Figure 8:
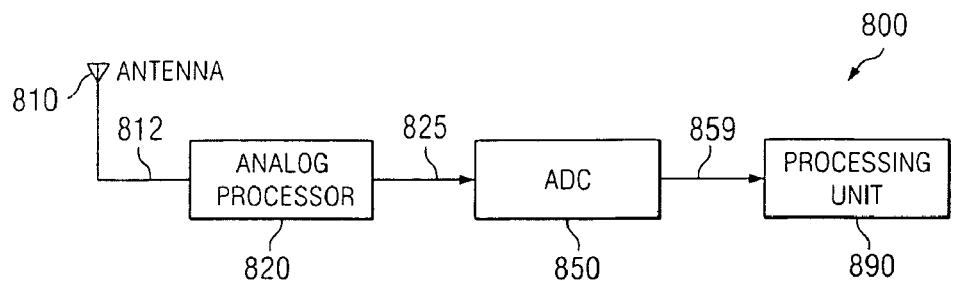
FIG. 8 is a block diagram of a device/system in which several aspects of the present invention can be implemented.

FIG. 8 is a block diagram of receiver system 800 illustrating an example system in which the present invention may be implemented. Receiver system 800, which may correspond to, for example, a mobile phone is shown containing antenna 810, analog processor 820, ADC 850, and processing unit 890. Each component is described in further detail below.

Antenna 810 may receive various signals transmitted over a wireless medium. The received signals may be provided to analog processor 820 on path 812 for further processing. Analog processor 820 may perform tasks such as amplification (or attenuation as desired), filtering, frequency conversion, etc., on received signals and provides the resulting signal on path 825.

ADC 850 converts the analog signal received on path 825 to corresponding digital codes. ADC 850 is a pipeline ADC and contains sub-ADCs implemented using comparators similar to comparator 500 or comparator 700 described with respect to FIGS. 5 and 7. ADC 850 provides the digital codes (substantially free of errors due to non-linear loads) to processing unit 890 on path 859 for further processing.

Processing unit 890 receives the recovered data to provide various user applications (such as telephone calls, data applications).

7. CONCLUSION

While various embodiments of the present invention have been described above, it should be understood that they have been presented by way of example only, and not limitation. Thus, the breadth and scope of the present invention should not be limited by any of the above-described embodiments, but should be defined only in accordance with the following claims and their equivalents.

What is claimed is:

1. A comparator to provide a comparison result of voltage levels of a first input signal and a second input signal, said comparator comprising:
a capacitor having a first terminal and a second terminal;
a transistor and a constant current sink together operating as a follower circuit, said transistor when ON providing a current path between a first terminal and a second terminal to said current sink, said transistor also having a control terminal coupled to said second terminal of said capacitor at a node;
a latch having a first input terminal, a second input terminal and an output terminal;
a first switch, a second switch, a third switch and a fourth switch, each having a first terminal and a second terminal,
said first switch connecting said first input signal to said first terminal of said capacitor in a closed position and disconnecting said first input signal from said first terminal of said capacitor in a open position,
said second switch connecting said second input signal to said first terminal of said capacitor in a closed position and disconnecting said second input signal from said first terminal of said capacitor in a open position,
said third switch connecting said node to a first bias voltage in a closed position and disconnecting said node from said first bias voltage in an open position,
said fourth switch connecting an output of said follower circuit to said first input terminal of said latch in a closed position and disconnecting said output of said followed circuit from said first input terminal of said latch in a open position,
wherein said first switch and said third switch are closed in a first duration to charge said capacitor to a voltage equaling the difference of said first bias voltage and said first input,
wherein said second switch is closed and said third switch and said first switch are opened in a second duration to cause a control voltage at said node to equal said bias voltage plus the difference of voltages of said first input signal and said second input signal,
wherein said fourth switch is closed during said second duration to cause said control voltage minus a threshold voltage across said control terminal and said second terminal of said transistor to provided on said first input terminal of said latch, and
whereby said output terminal of said latch provides said comparison result in the form of a binary value.

2. The comparator of claim 1, wherein said first bias voltage is chosen to operate said transistor in a saturation region, whereby the load presented to said first input signal is substantially constant.

3. The comparator of claim 2, wherein each of said first input signal and said second input signal is received in a singled ended form, and wherein said second input terminal is driven by a voltage equal to a difference of said first bias voltage and said threshold voltage.

4. The comparator of claim 2, wherein each of said first input signal and said second input signal is received in a differential form.

5. The comparator of claim 2, wherein said transistor is a metal oxide semiconductor field effect transistor and said follower circuit comprises a source follower.

6. The comparator of claim 5, wherein said output of said source follower circuit is provided at a node formed by said constant current sink and a source terminal of said transistor, wherein said second terminal of said transistor is said source terminal.

7. The comparator of claim 6, wherein said first terminal of said transistor is connected to a second bias voltage and said current sink is provided between a third bias voltage and said source terminal of said transistor.

8. The comparator of claim 1, wherein said transistor is a bipolar junction transistor (BJT) and said follower circuit comprises an emitter follower, wherein said first bias voltage is chosen to operate said transistor in an active region.

9. A stage of a pipeline analog to digital converter (ADC) processing a first input signal, said stage comprising:
a residue block to generate a residue signal by subtracting said first input signal from a signal level representing a digital value; and
a sub-ADC portion to generate said digital value representing a strength of said first input signal by comparing said first input signal with a reference voltage operating as a second input signal, said sub-ADC comprising a comparator to generate a comparison result, said comparator comprising:

a capacitor having a first terminal and a second terminal;

a transistor and a constant current sink together operating as a follower circuit, said transistor when ON providing a current path between a first terminal and a second terminal to said current sink, said transistor also having a control terminal coupled to said second terminal of said capacitor at a node;

a latch having a first input terminal, a second input terminal and an output terminal;

a first switch, a second switch, a third switch and a fourth switch, each having a first terminal and a second terminal, said first switch connecting said first input signal to said first terminal of said capacitor in a closed position and disconnecting said first input signal from said first terminal of said capacitor in a open position, said second switch connecting said second input signal to said first terminal of said capacitor in a closed position and disconnecting said second input signal from said first terminal of said capacitor in a open position, said third switch connecting said node to a first bias voltage in a closed position and disconnecting said node from said first bias voltage in an open position, said fourth switch connecting an output of said follower circuit to said first input terminal of said latch in a closed position and disconnecting said output of said followed circuit from said first input terminal of said latch in a open position, wherein said first switch and said third switch are closed in a first duration to charge said capacitor to a voltage equaling the difference of said first bias voltage and said first input, wherein said second switch is closed and said third switch and said first switch are opened in a second duration to cause a control voltage at said node to equal said bias voltage plus the difference of voltages of said first input signal and said second input signal, wherein said fourth switch is closed during said second duration to cause said control voltage minus a threshold voltage across said control terminal and said second terminal of said transistor to provided on said first input terminal of said latch, and whereby said output terminal of said latch provides said comparison result in the form of a binary value.

10. The stage of claim 9, wherein said first bias voltage is chosen to operate said transistor in a saturation region, whereby the load presented to said first input signal is substantially constant.

11. The stage of claim 10, wherein each of said first input signal and said second input signal is received in a singled ended form, and wherein said second input terminal is driven by a voltage equal to a difference of said first bias voltage and said threshold voltage.

12. The stage of claim 10, wherein each of said first input signal and said second input signal is received in a differential form.

13. The stage of claim 10, wherein said transistor is a metal oxide semiconductor field effect transistor and said follower circuit comprises a source follower.

14. The stage of claim 13, wherein said output of said source follower circuit is provided at a node formed by said constant current sink and a source terminal of said transistor, wherein said second terminal of said transistor is said source terminal.

15. The stage of claim 14, wherein said first terminal of said transistor is connected to a second bias voltage and said current sink is provided between a third bias voltage and said source terminal of said transistor.

16. The stage of claim 9, wherein said transistor is a bipolar junction transistor (BJT) and said follower circuit comprises an emitter follower, wherein said first bias voltage is chosen to operate said transistor in an active region.

* * * * *